United States Patent [19]
Fujikura

[11] Patent Number: 5,985,690
[45] Date of Patent: Nov. 16, 1999

[54] METHOD OF MANUFACTURING CONTACT IMAGE SENSOR

[75] Inventor: Katsuyuki Fujikura, Tokyo, Japan

[73] Assignee: NEC Corporation, Tokyo, Japan

[21] Appl. No.: 08/588,313

[22] Filed: Jan. 18, 1996

[30] Foreign Application Priority Data

Jan. 30, 1995 [JP] Japan ..................... 7-013126

[51] Int. Cl.$^6$ ............................. H01L 27/146
[52] U.S. Cl. ..................... 438/68; 438/460; 438/75; 438/98
[58] Field of Search .................. 438/30, 33, 68, 438/75, 144, 460, 462, 98

[56] References Cited

U.S. PATENT DOCUMENTS

| | | | |
|---|---|---|---|
| 5,337,474 | 8/1994 | Oka et al. | 29/846 |
| 5,359,206 | 10/1994 | Yamamoto et al. | 257/350 |
| 5,384,266 | 1/1995 | Chapman | 438/30 |
| 5,422,293 | 6/1995 | Konya | 438/30 |
| 5,580,800 | 12/1996 | Zhang et al. | 438/669 |
| 5,798,534 | 8/1995 | Young | 438/30 |

FOREIGN PATENT DOCUMENTS

| | | |
|---|---|---|
| 2-98966 | 4/1990 | Japan . |
| 4-287020 | 10/1992 | Japan . |

*Primary Examiner*—Savitri Mulpuri
*Attorney, Agent, or Firm*—Sughrue, Mion, Zinn, Macpeak & Seas, PLLC

[57] ABSTRACT

A contact image sensor has a plurality of sensor elements on an insulating substrate, the sensor elements having electrodes as common electrodes and other electrodes as individual electrodes. The contact image sensor is manufactured by extending the common electrodes and the individual electrodes out of a document passage region, and forming short-circuiting patterns which electrically connect the common electrodes and the individual electrodes outside of the document passage region through pads which connect ICs for energizing the contact image sensor. After the ICs are connected to the pads, the insulating substrate is cut along the short-circuiting patterns to break the electrical connection between the common electrodes and the individual electrodes.

10 Claims, 7 Drawing Sheets

METHOD OF MANUFACTURING CONTACT IMAGE SENSOR

BACKGROUND OF THE INVENTION

1. Field of the Invention

The present invention relates to a method of manufacturing a contact image sensor for reading an image document or the like, and more particularly to a method of manufacturing a contact image sensor having a structure which is prevented from electrostatic destruction due to triboelectricity produced when an image document or the like moves with respect to the contact image sensor.

2. Description of the Related Art

Image sensors are used to read an image document and convert the image document into an electric signal in image scanners, facsimile machines, or the like. The image sensors that are available at present are roughly classified into two types, i.e., an optical image sensor having a size-reduction optical system including lenses for focusing an image document at a reduced scale onto a CCD (charge-coupled device) to read the image document, and a contact image sensor having a sensor unit composed of a plurality of sensor elements formed according to a thin-film fabrication process on an insulating substrate which has a width greater than the width of an image document to be read, the sensor unit being held in direct contact with the image document without any size-reduction optical system interposed therebetween.

The contact image sensor may be easily reduced in size and cost because it uses no lenses. Since the contact image sensor is fabricated according to a thin-film fabrication process, it can be mass-produced by forming a plurality of image sensor patterns on a single insulating substrate and then cutting off the substrate into a plurality of contact image sensors.

The contact image sensor, however, has a problem in that it can easily be electrostatically charged because the insulating substrate is made of glass or the like. In the fabrication process, the insulating substrate tends to be electrostatically charged, causing sensor elements on the insulating substrate to be electrostatically destroyed. The susceptibility to triboelectric destruction has been responsible for a low yield of contact image sensors.

Japanese laid-open patent publication No. 2-98966 discloses a method of fabricating a contact image sensor in an attempt to solve the above problem. As shown in FIG. 1 of the accompanying drawings., a plurality of individual electrodes 302 of chromium and a short-circuiting pattern 303 are formed on a glass substrate 301. The individual electrodes 302 are composed of pixel electrodes 302a and leading electrodes 302b, the pixel electrodes 302a being arranged in two rows A, B extending in the longitudinal direction of the glass substrate 301. The short-circuiting pattern 303 is positioned between the two rows of the pixel electrodes 302a, and comprises a horizontal pattern 303a extending in the longitudinal direction of the glass substrate 301 and a plurality of vertical patterns 303b extending transversely across the horizontal pattern 303a and connecting respective pairs of the pixel electrodes 302a.

All the pixel electrodes 302a are covered with a photo-semiconductor layer 308, on which there are disposed two common electrodes 304 in covering relationship to the pixel electrodes 302a of the respective rows A, B, thus producing two elongate sensor units of sandwiched structure on the glass substrate 301.

Then, a plurality of ICs 306 are mounted on the glass substrate 301, and pads of the ICs 306 and ends of the leading electrodes 302b are interconnected by bonding wires 307. Thereafter, the glass substrate 301 is cut off along the horizontal pattern 303a by a slicing machine having a slicing blade which is wider than the horizontal pattern 303a, breaking the electric connection between the paired individual electrodes 302. Before the ICs 306 and the individual electrodes 302 are connected, the individual electrodes 302 and the common electrodes 304 remain connected to each other with no potential difference developed therebetween. Accordingly, the sensor unit is prevented from being electrostatically destroyed in the fabrication process.

The contact image sensor operates by holding the sensor units against an image document, and scanning the sensor units over the image document to read an image thereon. Since the image document is normally made of paper and hence is insulative, triboelectricity is generated between the glass substrate and the image document. FIG. 2 of the accompanying drawings shows a cross section of the contact image sensor after the glass substrate 301 is cut off along the horizontal pattern 303a. Since the vertical patterns 303b extending from the individual electrodes 302 have ends exposed in a region where the image document moves with respect to the contact image sensor, triboelectricity tends to be discharged to the exposed ends of the vertical patterns 303b, and the sensor unit is likely to be electrostatically broken during usage of the contact image sensor.

One solution would be to position the exposed ends of the vertical patterns 303b outside of the region where the image document moves with respect to the contact image sensor. However, because all the vertical patterns 303b extend from the individual electrodes 302, a very wide wiring pattern area would be needed to position the exposed ends of all the vertical patterns 303b outside of the region where the image document moves with respect to the contact image sensor. Not only signal wires but also a new wire just for short-circuiting the individual electrodes would be required in such a very wide wiring pattern area. Consequently, such an arrangement would result in an increase in the cost owing to an increase in the size of the glass substrate, and would be uneconomical in terms of effective utilization of the area available on the glass substrate.

SUMMARY OF THE INVENTION

It is therefore an object of the present invention to provide a method of manufacturing a contact image sensor which is prevented from being electrostatically destroyed in a fabrication process thereof and also when it is used to read an image document.

To achieve the above object, there is provided in accordance with the present invention a method of manufacturing a contact image sensor having a plurality of sensor elements on an insulating substrate, the sensor elements having electrodes as common electrodes and other electrodes as individual electrodes, comprising the steps of extending the common electrodes and the individual electrodes out of a document passage region, and forming short-circuiting patterns which electrically connect the common electrodes and the individual electrodes outside of the document passage region through pads which connect ICs for energizing the contact image sensor, and after the ICs are connected to the pads, cutting the insulating substrate along the short-circuiting patterns to break the electrical connection between the common electrodes and the individual electrodes.

The contact image sensor may have a plurality of switching elements electrically connected respectively to the sensor elements, the switching elements having respective gate electrodes as common electrodes and respective drain or source electrodes as individual electrodes.

The sensor elements and the switching elements may be divided into a plurality of blocks, the individual electrodes of the blocks being connected in a matrix pattern, the common electrodes being associated with the respective blocks.

The insulating substrate may be cut in a plurality of cycles.

With the above arrangement of the present invention, until the insulating substrate is cut off along the short-circuiting patterns, the common electrodes and the individual electrodes remain electrically connected through the short-circuiting patterns. Therefore, the sensor elements are prevented from being electrostatically destroyed during a fabrication process. After the insulating substrate is cut off, since cut surfaces of the common electrodes and the individual electrodes are positioned outside of the document passage region, the sensor elements are also prevented from being electrostatically destroyed due to triboelectricity produced when an image document is read. Because the common electrodes and the individual electrodes are connected by leading lines which are connected to not only the short-circuiting patterns but also the ICs, the area available on the insulating substrate is effectively utilized.

The above and other objects, features, and advantages of the present invention will become apparent from the following description with reference to the accompanying drawings which illustrate an example of the present invention.

DETAILED DESCRIPTION OF THE PREFERRED EMBODIMENT

Figure 1:
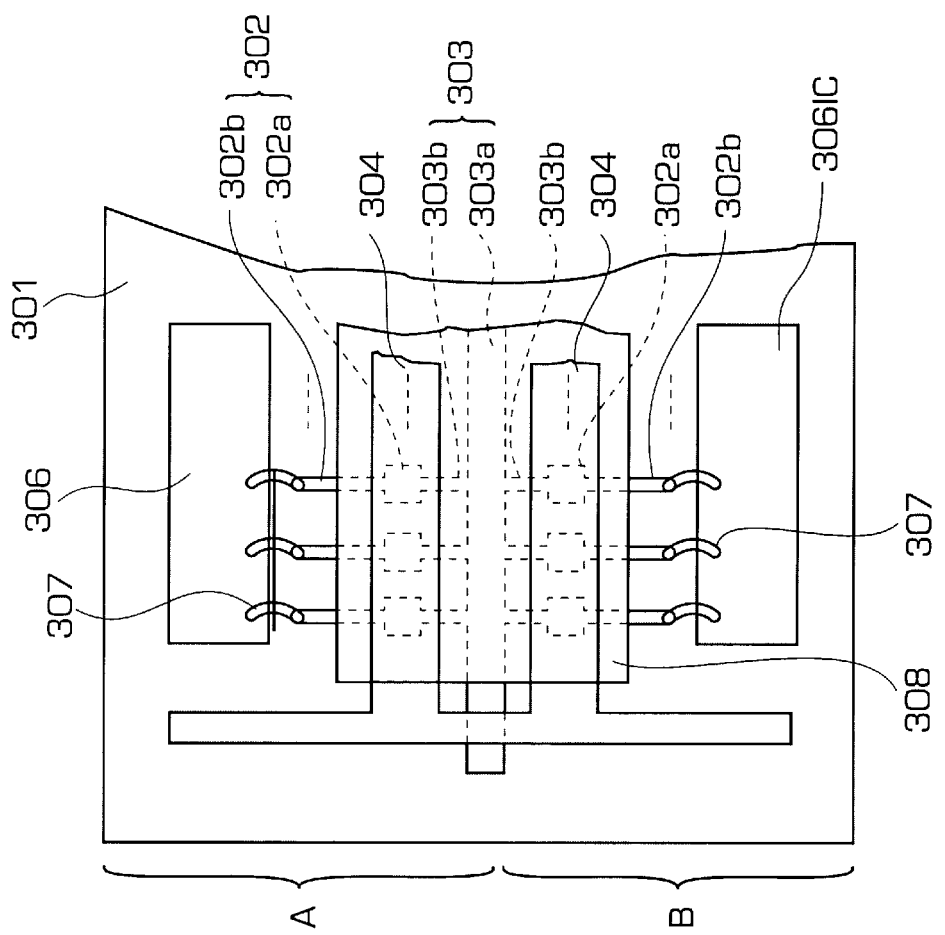
FIG. 1 is a fragmentary plan view of a substrate, illustrative of a conventional method of manufacturing a contact image sensor.
Figure 2:
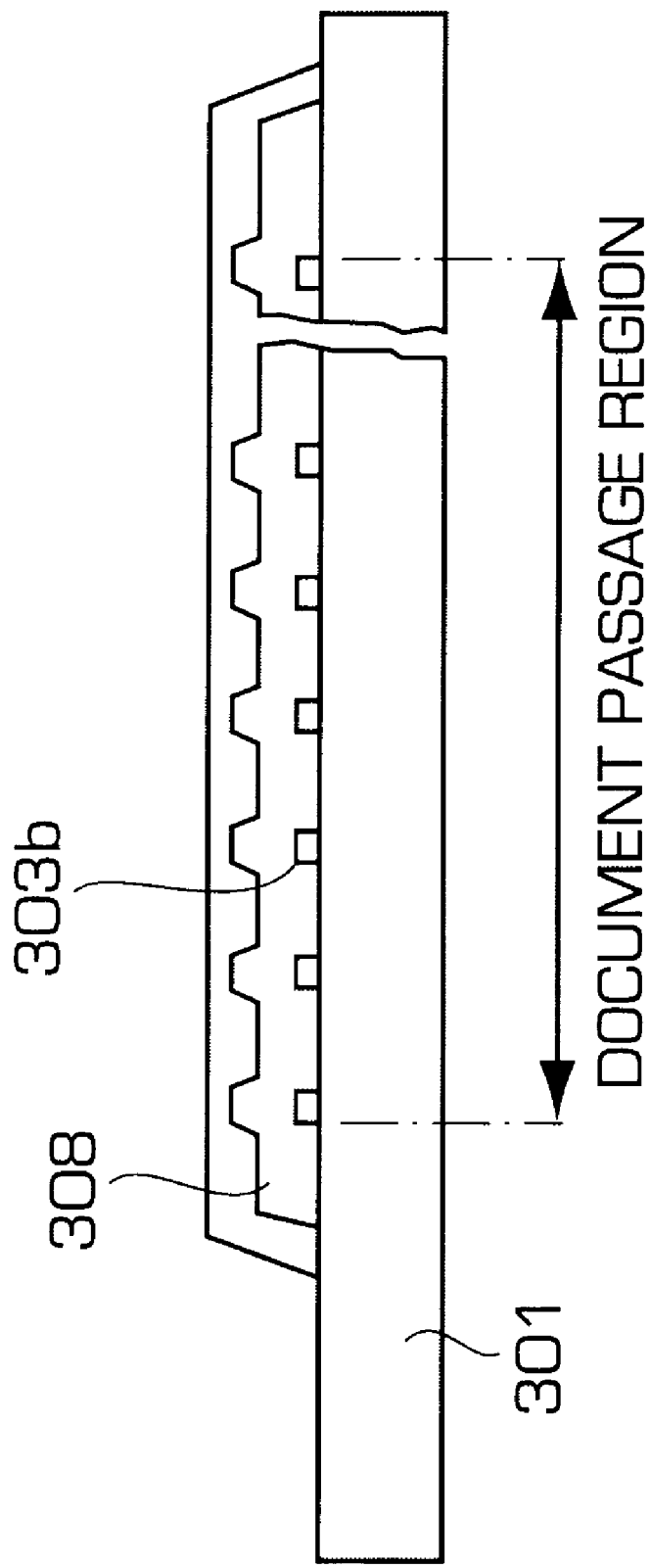
FIG. 2 is a cross-sectional view of a glass substrate after it is cut off along a short-circuiting pattern shown in FIG. 1.
Figure 3:
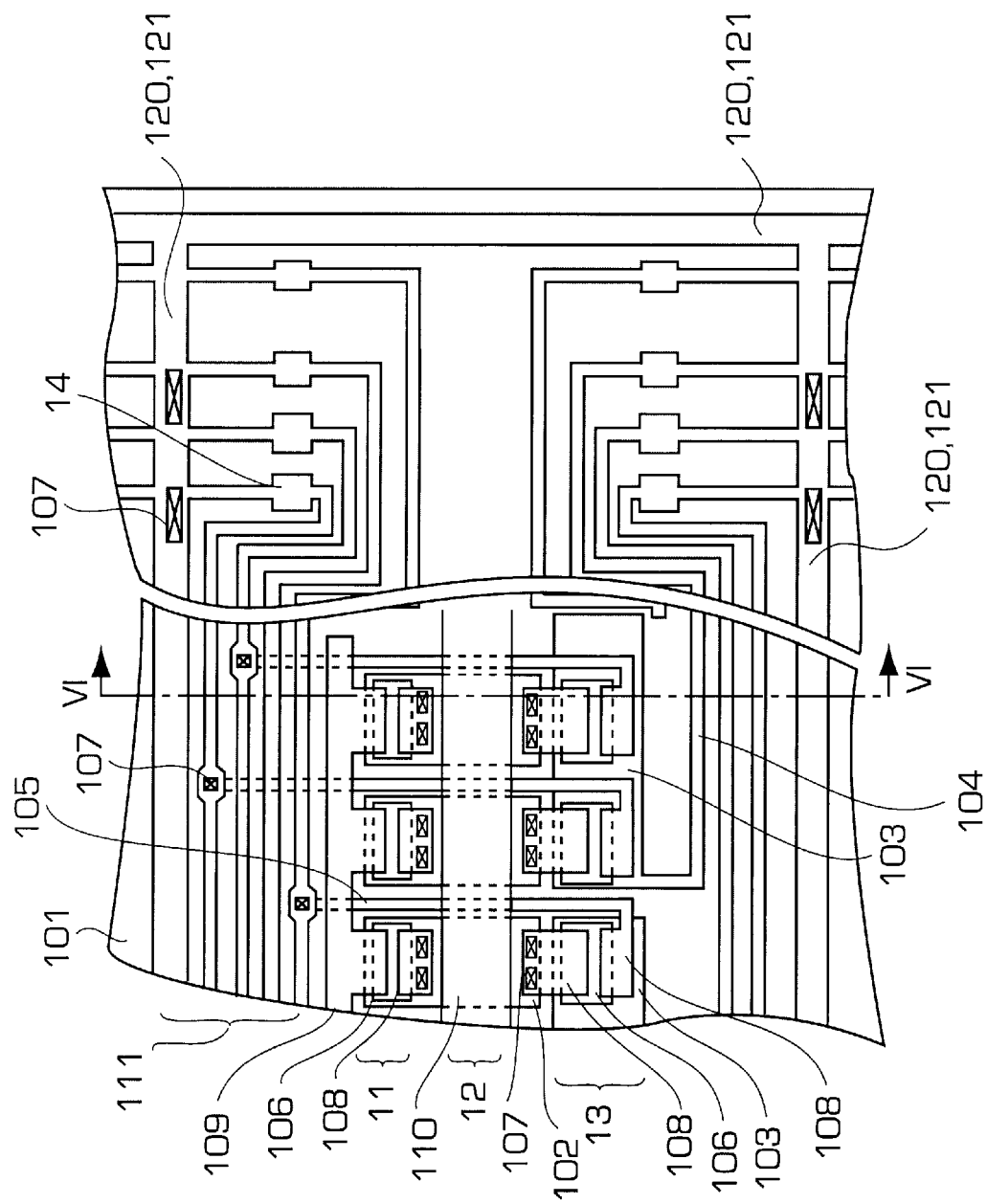
FIG. 3 is a fragmentary plan view of a substrate, illustrative of a method of manufacturing a contact image sensor according to the present invention.

FIG. 3 shows in plan a portion of a substrate for manufacturing a plurality of contact image sensors, the substrate carrying a plurality of patterns arranged in a vertical array in the same way as those shown in one.

As shown in FIG. 3, a glass substrate 101 supports a horizontal array of sensor elements 11 each comprising a lower layer electrode 102 serving as a gate electrode, a channel region 106 formed on the lower layer electrode 102, a source/drain electrode layer 108 formed on the channel region 106 and electrically connected to the lower layer electrode 102, and a common power supply line 109 formed on the channel region 106 and spaced from the source/drain electrode layer 108. Each of the sensor elements 11 is associated with a charge storage means 12 and a switching element 13.

ICs (not shown) for energizing the switching elements 13 and processing read signals are mounted on the glass substrate 101 outside of a document passage region where an image document passes when it is read. Individual leading lines 105 extend out of the document passage region through individual signal lines 111 serving as individual electrodes, and common gate electrodes 103 also extend out of the document passage region through common drive lines 104. The individual signal lines 111 and the common drive lines 104 have respective IC pads 14 outside of the document passage region, and IC pins are mounted on the IC pads 14. The ICs for energizing the switching elements 13 and processing read signals may be separate from each other or may be combined as one IC.

Figure 4:
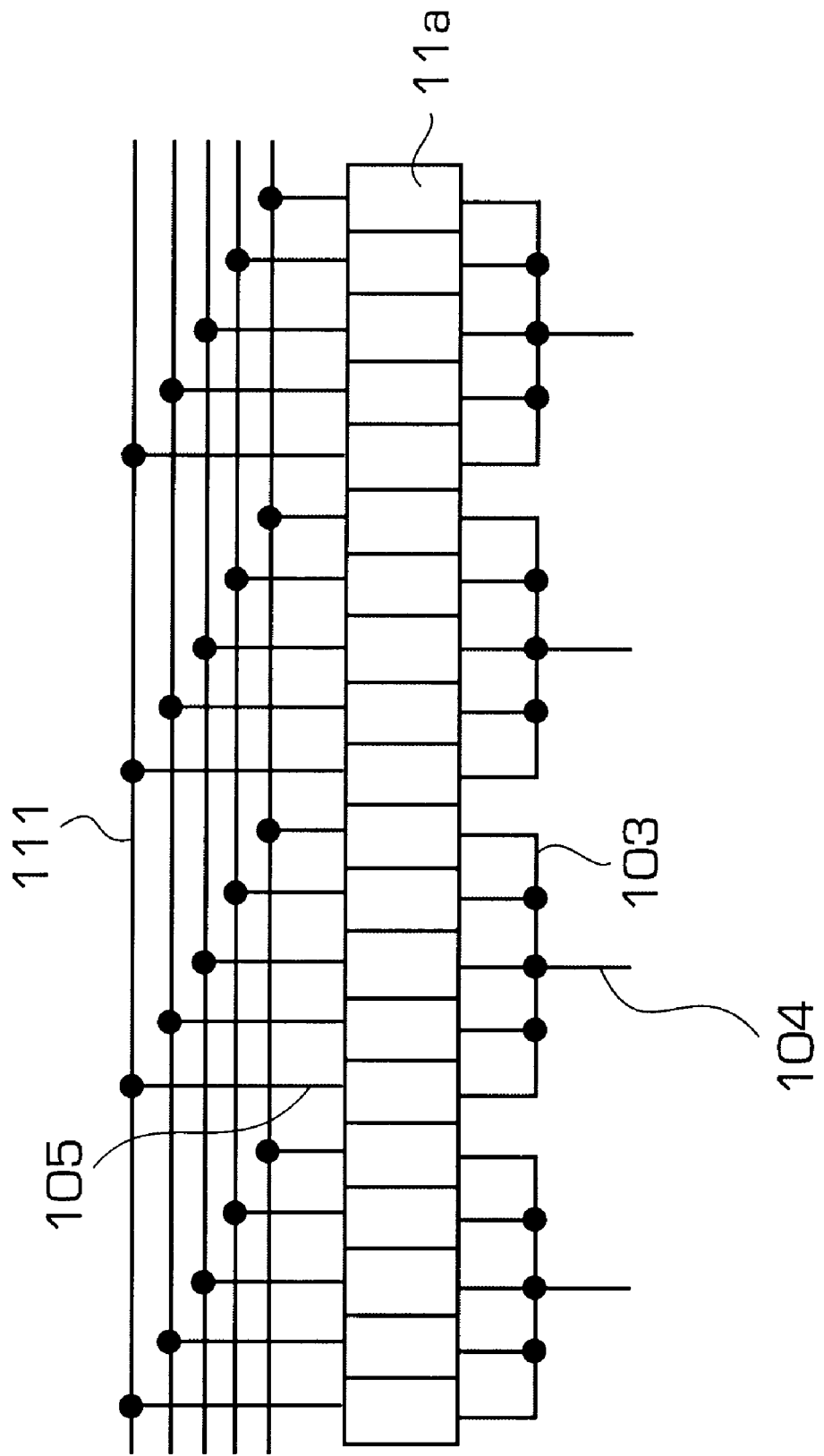
FIG. 4 is a diagram schematically showing a pattern by which sensor elements are interconnected in a matrix.
Figure 5:
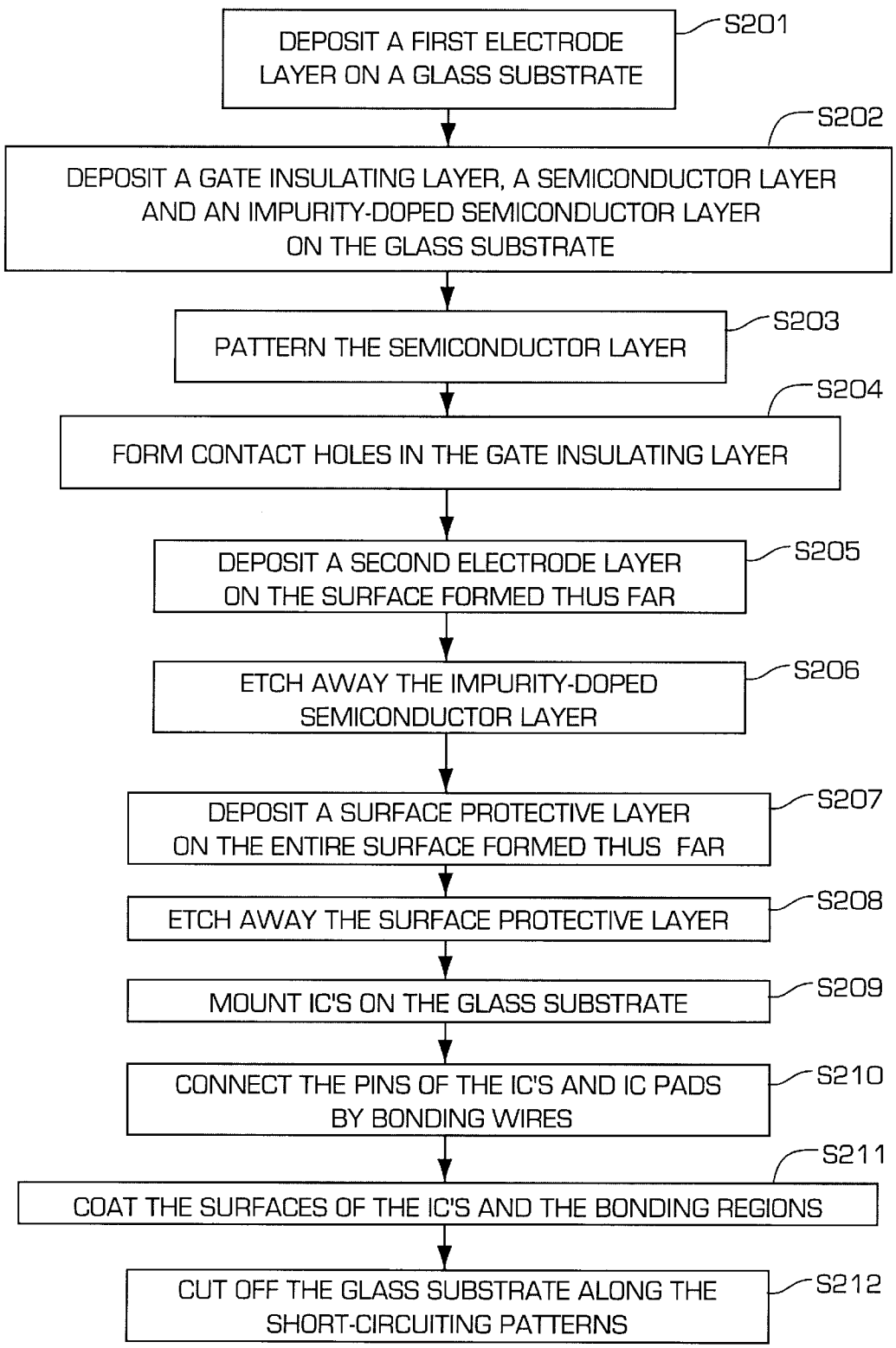
FIG. 5 is a flowchart of a sequence of the method of manufacturing the contact image sensor shown in FIG. 3.
Figure 6A:
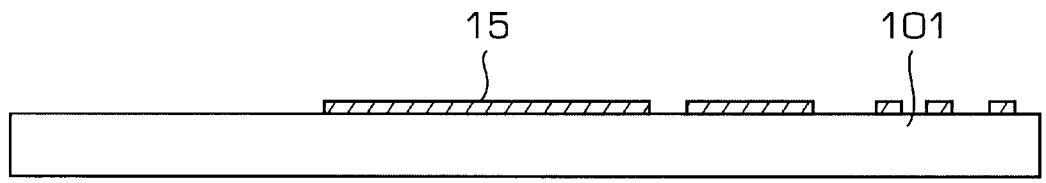
FIGS. 6(a) through 6(d) are cross-sectional views taken along line VI—VI of FIG. 3, showing successive steps of the method of manufacturing the contact image sensor shown in FIG. 3 before ICs are mounted.
Figure 6B:
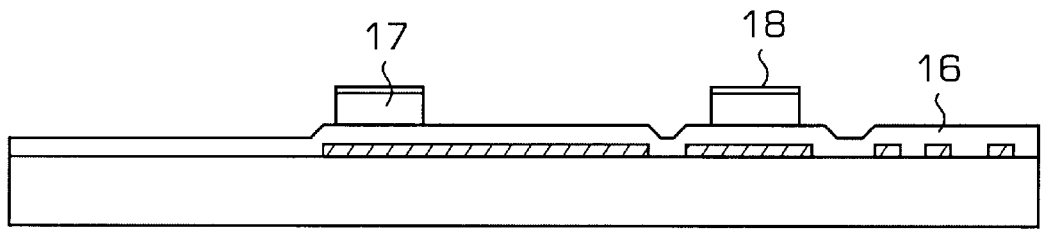
Figure 6C:
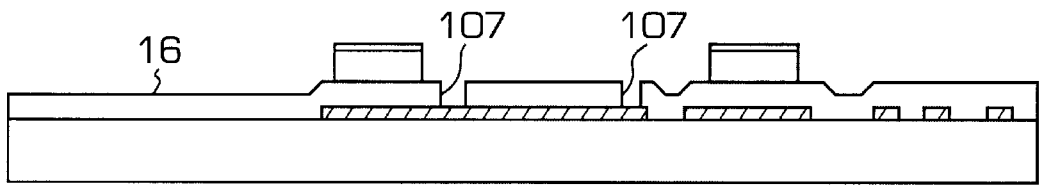
Figure 6D:
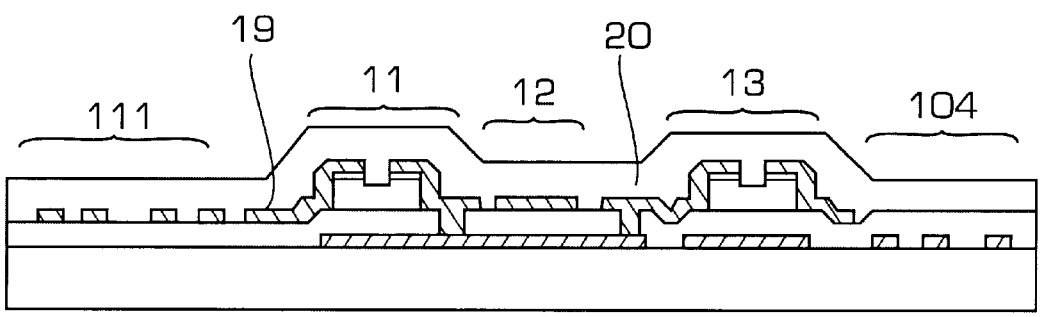

A pattern by which the sensor elements 11 are interconnected in a matrix will be described below with reference to FIG. 4. In FIG. 3, the individual and common lines are connected to each of the switching elements 13. In FIG. 4, each combination of the sensor elements 11, the charge storage means 12, and the switching elements 13 is indicated as a sensor element 11a for illustrative purpose.

In FIG. 4, the sensor elements 11a are divided into four blocks each composed of five sensor elements 11a interconnected by a common gate electrode 103. The sensor elements 11a are interconnected in a matrix by individual leading lines 105 and individual signal lines 111. The common gate electrode 103 which interconnects the sensor elements 11a in each block is connected to a common drive line 104. The sensor elements can be energized when they are successively scanned block by block.

The matrix pattern by which the sensor elements 11a are interconnected is effective in greatly reducing the number of output signal lines from the sensor elements 11a. For example, if there are 20 sensor elements 11a, then 20 signal output lines are usually required. However, the matrix pattern shown in FIG. 4 requires only five individual signal lines 111, with the result that the area in which lines are needed to be laid is greatly reduced, and the area available on the glass substrate 101 can effectively be utilized. The matrix pattern shown in FIG. 4 is particularly effective for an image sensor which has a number of sensor elements. If, however, many output signal lines do not present any significant problem, then it is not necessary to divide sensor elements into a plurality of blocks and interconnect them in a matrix pattern.

While the sensor elements 11, the charge storing means 12, and the switching elements 13 are illustrated in this embodiment, the contact image sensor according to the present invention is not limited to the illustrated arrangement. The contact image sensor does not necessarily include charge storing means, but may include sensor elements in the form of photodiodes.

A method of fabricating the contact image sensor will be described below with reference to FIGS. 3, 5, and 6(a) through 6(d). Steps (a) through (d) of the fabricating method, among other steps described below, correspond respectively to FIGS. 6(a) through 6(d).

Step (a):

A first electrode layer 15 is deposited as a thin metal film of chromium or the like on the glass substrate 101, thereby forming the lower layer electrode 102 doubling as a gate electrode of each of the sensor elements 11 and an electrode of the charge storage means 12, the common gate electrodes 103 of the switching elements 13, the common drive lines 104 extending from the common gate electrodes 103, the individual leading lines 105 for extracting read signals from the respective switching elements, and short-circuiting patterns 120 electrically short-circuiting the common drive lines 104 and extending in the direction of the array of sensor elements 11, in a step S201.

In this embodiment, the switching elements 13 are divided into blocks each composed of plural switching elements 13 interconnected by a common gate electrode 103. The common drive lines 104 extend in a main scanning direction of the sensor elements 11, i.e., in the direction of the array of sensor elements 11, out of the document passage region on the side of the IC pads 14, and then extend through the IC pads 14 and are connected to the short-circuiting patterns 120.

Step (b):

A gate insulating layer 16 of silicon oxide, silicon nitride, or both silicon oxide and silicon nitride is deposited on the glass substrate 101 and the first electrode layer 15 formed thereon by a process such as plasma CVD or the like, and thereafter, a semiconductor layer 17 and an impurity-doped semiconductor layer 18 in which an impurity such as of phosphorus is mixed by way of a gas are deposited on the entire surface of the gate insulating layer 16 in a step S202. The semiconductor layer 17 is then patterned into portions which will serve as the channel regions 106 in a step S203.

Step (c):

Contact holes 107 are formed in the gate insulating layer 16 which has been deposited on the glass substrate 101 and the first electrode layer 15 in a step S204.

Step (d):

A second electrode layer 19 is deposited as a thin metal film of chromium, aluminum, or the like on the surface formed thus far, thereby forming the source/drain electrode layers 108, the common power supply lines 109, upper layer electrodes 110 of the charge storage means 12, the individual signal lines 111, and short-circuiting patterns 121 electrically short-circuiting the individual signal lines 111 in a step S205. The individual signal lines 111 extend out of the document passage region on the side of the IC pads 14, and then extend through the IC pads 14 and are connected to the short-circuiting patterns 120. The short-circuiting patterns 121 are formed in overlapping relation along the upper surfaces of the short-circuiting patterns 120 previously formed. The first electrode layer 15 and the second electrode layer 19 are now electrically connected to each other through the contact holes 107. The contact holes 107 are not necessarily positioned on the short-circuiting patterns 120, but may be formed in the IC pads 14.

Using the second electrode layer 19 as a mask, the impurity-doped semiconductor layer 18 is etched away in a step S206, thereby forming the channel regions 106 between the source/drain electrode layers 108 of the sensor elements 11 and the common power supply line 109 and also between the source/drain electrode layers 108 of the switching elements 13. A surface protective layer 20 of silicon nitride, resin, or the like is then deposited on the entire surface formed thus far in a step S207. Thereafter, the surface protective layer 20 is partially etched away from the IC pads 14 in a step 208, exposing the metal surface of the IC pads 14.

Step (e):

The ICs for energizing the switching elements 13 and processing read signals are mounted on the glass substrate 101 outside of the document passage region in a step S209, and the pins of the ICs and the IC pads 14 are connected to each other by bonding wires in a step S210. After the ICs are mounted, the surfaces of the ICs and the bonding regions are coated with a resin layer or the like for surface protection in a step S211.

Step (f):

The glass substrate 101 is cut off along the short-circuiting patterns 120, 121 by a slicing machine having a slicing blade which is wider than the short-circuiting patterns 120, 121 in a step S212. When the glass substrate 101 is thus cut off, the electric connection between the common drive lines 104 and also between the individual signal lines 111 is broken, and a plurality of contact sensors are completed.

Until the short-circuiting patterns 120, 121 are severed, the first electrode layer 15 and the second electrode layer 19 remain electrically connected to each other, and hence the common gate electrodes 103 remain electrically connected to the individual signal lines 111. Therefore, until the short-circuiting patterns 120, 121 are severed, no potential difference is developed between the common gate electrodes 103 and the individual signal lines 111, so that the sensor elements 11 are prevented from being electrostatically destroyed during the fabrication process.

Figure 7:
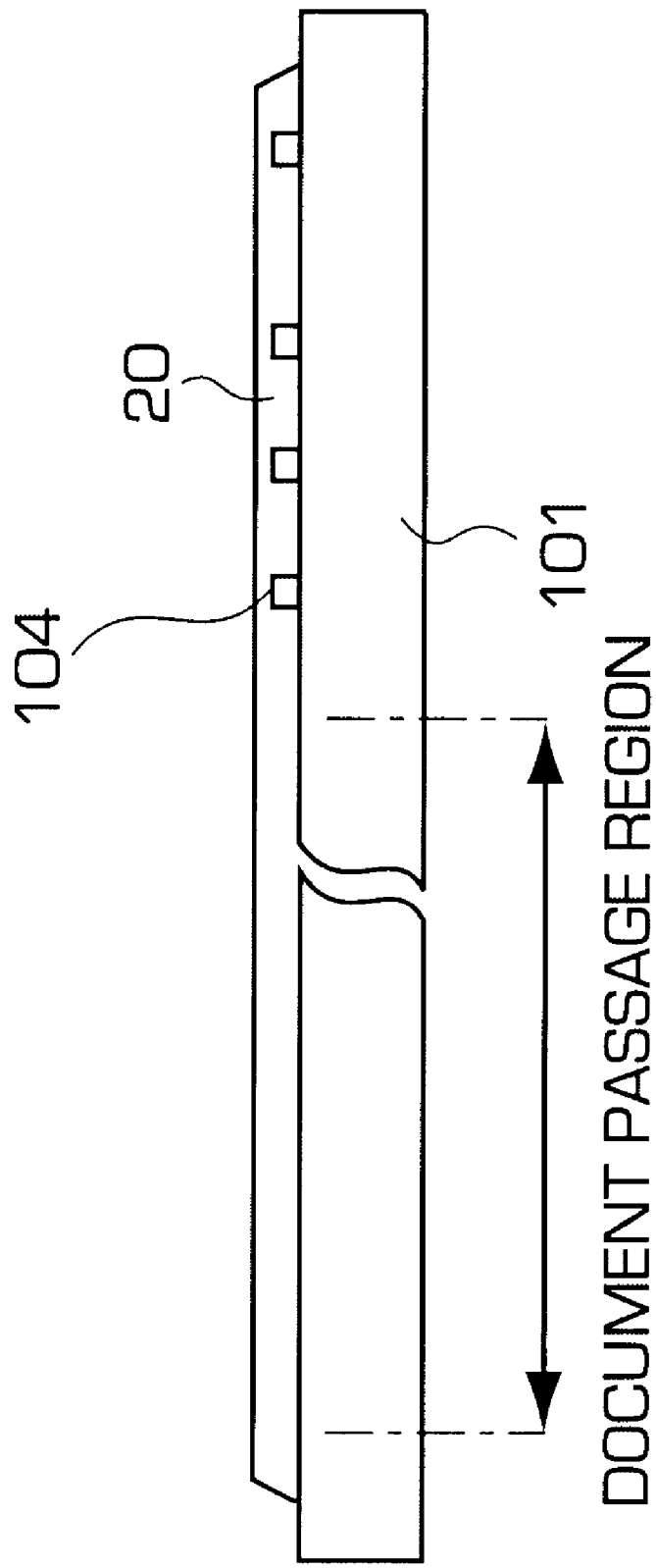
FIG. 7 is a cross-sectional view of a glass substrate after it is cut off along a short-circuiting pattern shown in FIG. 3.

FIG. 7 shows a cross section of the glass substrate 101 cut off along the short-circuiting patterns 120, 121 shown in FIG. 3. It can be seen from FIG. 7 that the severed ends of the common drive lines 104 are positioned outside of the document passage region. Consequently, the sensor elements 11 are prevented from being electrostatically destroyed due to triboelectricity produced between an image document and the glass substrate 101 when the image document moves with respect to the contact image sensor. The end surface of the glass substrate 101 outside of the document travel region and the cut surfaces of the short-circuiting patterns 120, 121 may also be coated with a resin layer or the like. If the cut surfaces of the short-circuiting patterns 120, 121 are thus coated with a resin layer or the like, then the sensor elements 11 are prevented more effectively from being electrostatically destroyed due to triboelectricity.

In the above embodiment, the glass substrate 101 is cut off in one cutting operation. When the glass substrate 101 is cut off in one cutting operation, however, the glass substrate 101 may be broken due to undue stress. To avoid such a problem, the glass substrate 101 may be cut off in several successive cutting operations rather than one cutting operation.

For example, a cut reaching the glass substrate 101 is formed along the short-circuiting patterns 120, 121 by a slicing machine having a slicing blade which is wider than the short-circuiting patterns 120, 121. At this time, the short-circuiting patterns 120, 121 are severed. Then, the glass substrate 101 is cut off along the cut formed in the first cutting operation by a slicing machine having a slicing blade which is narrower than the slicing blade used in the first cutting operation. Alternatively, the first cutting operation may be carried out in a plurality of cycles using a slicing machine having a slicing blade which is narrower than the short-circuiting patterns 120, 121. Specifically, a cutting process along the short-circuiting patterns 120, 121 may be carried out in a plurality of cycles with the slicing blade being shifted transversely across the short-circuiting patterns 120, 121 each time, thereby forming a cut wider than the short-circuiting patterns 120, 121 in the glass substrate 101, and thereafter the glass substrate 101 is cut off by the slicing machine.

When the glass substrate 101 is cut off in a plurality of cycles, any stress applied to the glass substrate 101 can be reduced. As a result, the glass substrate 101 is less liable to crack when it is cut off, resulting in an improved yield of contact image sensors. If a slicing machine having a slicing blade which is narrower than the short-circuiting patterns 120, 121 is used, then the process of forming a cut in the glass substrate 101 and the process of cutting off the glass substrate 101 can be carried out by the same slicing machine.

In the above embodiment, the common electrodes are formed on the first electrode layer 15, and the individual electrodes are formed on the second electrode layer 19. However, the common electrodes may be formed on the second electrode layer 19, and the individual electrodes are formed on the first electrode layer 15. In such a modification, the sequence of depositing the gate insulating layer 16, the semiconductor layer 17, and the impurity-doped semiconductor layer 18, and the patterning thereof may be modified as required.

The method of manufacturing a contact image sensor according to the present invention offers the following advantages:

Since the common electrodes and the individual electrodes are connected to the short-circuiting patterns out of the document passage region, the sensor elements are prevented from being electrostatically destroyed during the fabrication process and also from being electrostatically destroyed due to triboelectricity generated between the document which moves when it is read and the insulating substrate. Therefore, the contact image sensor is highly reliable in operation.

Inasmuch as the leading lines by which the common electrodes and the individual electrodes are connected to the short-circuiting patterns double as the leading lines connected to the ICs, the area available on the glass substrate is effectively utilized, and hence the contact image sensor is relatively small in size and low in cost. The sensor elements ar e divided into a plurality of blocks, and the individual electrodes of the blocks are connected in a matrix pattern. With this arrangement, the number of individual electrodes is reduced, allowing the area available on the glass substrate to be more effectively utilized.

When the insulating substrate is cut off, it is prevented from cracking if it is cut in a plurality of operations.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a contact image sensor having a plurality of sensor elements on an insulating substrate, the sensor elements having electrodes as common electrodes and other electrodes as individual electrodes, comprising the steps of:

extending the common electrodes and the individual electrodes out of a document passage region, and forming short-circuiting patterns which electrically connect the common electrodes and the individual electrodes outside of the document passage region through pads which connect ICs for energizing the contact image sensor; and after the ICs are connected to the pads, cutting said insulating substrate along said short-circuiting patterns to break the electrical connection between said common electrodes and said individual electrodes.

2. A method according to claim 1, wherein said contact image sensor has a plurality of switching elements electrically connected respectively to said sensor elements, said switching elements having respective gate electrodes as common electrodes and respective drain or source electrodes as individual electrodes.

3. A method according to claim 2, wherein said sensor elements and said switching elements are divided into a plurality of blocks, the individual electrodes of the blocks being connected in a matrix pattern, said common electrodes being associated with the respective blocks.

4. A method according to claim 1, wherein said insulating substrate is cut in a plurality of cycles.

5. A method of manufacturing a contact image sensor having a plurality of sensor elements on an insulating substrate, said sensor elements having electrodes as common electrodes and other electrodes as individual electrodes, comprising the steps of:

extending said common electrodes and said individual electrodes out of a document passage region, and forming short-circuiting patterns which electrically connect said common electrodes and said individual electrodes outside of said document passage region through pads which connect ICs for energizing said contact image sensor; and cutting said insulating substrate, after said ICs are connected to said pads, along said short-circuiting patterns to break the electrical connection between said common electrodes and said individual electrodes;

wherein cutting of said insulating substrate occurs in a plurality of cycles and comprises the steps of:

forming a cut reaching said insulating substrate along said short-circuiting patterns with a slicing machine having a slicing blade which is wider than said short-circuiting patterns; and cutting off said insulating substrate along said cut with a slicing machine having a slicing blade which is narrower than said slicing blade which is wider than said short-circuiting patterns.

6. A method according to claim 4, wherein said step of cutting said insulating substrate comprises the steps of:

carrying out a cutting process along the short-circuiting patterns with a slicing machine having a slicing blade which is narrower than said short-circuiting patterns, in a plurality of cycles with the slicing blade being shifted transversely across the short-circuiting patterns each time, thereby forming a cut wider than the short-circuiting patterns in said insulating substrate; and cutting off said insulating substrate with said slicing machine.

7. A method according to claim 1, further comprising the step of coating a cut surface of said insulating substrate.

8. A method according to claim 5, wherein said contact image sensor has a plurality of switching elements electrically connected respectively to said sensor elements, said switching elements having respective gate electrodes as common electrodes and respective drain or source electrodes as individual electrodes.

9. A method according to claim 8, wherein said sensor elements and said switching elements are divided into a plurality of blocks, the individual electrodes of the blocks being connected in a matrix pattern, said common electrodes being associated with the respective blocks.

10. A method according to claim 8, further comprising the step of coating a cut surface of said insulating substrate.

* * * * *